(12) United States Patent
Call et al.

(10) Patent No.: US 8,850,695 B1
(45) Date of Patent: Oct. 7, 2014

(54) PRINTED CIRCUIT BOARD ASSEMBLY TOOLING

(75) Inventors: Norman L. Call, Los Angeles, CA (US); Jose M. Chavez, Walnut, CA (US); Rodolfo Chavez, West Hills, CA (US)

(73) Assignee: The Boeing Company, Chicago, IL (US)

( * ) Notice: Subject to any disclaimer, the term of this patent is extended or adjusted under 35 U.S.C. 154(b) by 643 days.

(21) Appl. No.: 12/652,091

(22) Filed: Jan. 5, 2010

(51) Int. Cl.
*B23P 19/00* (2006.01)

(52) U.S. Cl.
USPC ............. 29/739; 29/729; 29/760; 29/830; 174/260; 269/236

(58) Field of Classification Search
CPC ............ H05K 3/0058; H05K 13/0069; H05K 1/0393; H05K 3/386; H05K 2201/015; H05K 2201/09909; H05K 2203/016; Y10S 269/903
USPC ........ 29/729, 739–743, 884, 874–876, 592.1, 29/732–736; 269/236, 267, 2; 174/255, 174/260–264; 228/41, 180.21–180.22
See application file for complete search history.

(56) References Cited

U.S. PATENT DOCUMENTS

| | | | | |
|---|---|---|---|---|
| 4,290,291 A | * | 9/1981 | Burns | 72/316 |
| 4,426,032 A | * | 1/1984 | Leodolter | 228/157 |
| 4,584,860 A | * | 4/1986 | Leonard | 72/61 |
| 5,298,464 A | * | 3/1994 | Schlesinger et al. | 156/312 |
| 5,337,151 A | * | 8/1994 | Baxter et al. | 356/401 |
| 5,410,132 A | | 4/1995 | Gregg et al. | |
| 5,548,372 A | * | 8/1996 | Schroeder et al. | 355/53 |
| 5,571,436 A | | 11/1996 | Gregg et al. | |
| 5,984,293 A | | 11/1999 | Abrahamson et al. | |
| 5,993,184 A | | 11/1999 | Morrow | |
| 6,131,255 A | * | 10/2000 | Atkins et al. | 29/25.01 |
| 6,378,857 B1 | | 4/2002 | Taylor | |
| 6,965,517 B2 | | 11/2005 | Wanes et al. | |
| 7,137,196 B2 | * | 11/2006 | Gunderson et al. | 29/884 |
| 7,166,252 B2 | | 1/2007 | Gochnour et al. | |
| 7,325,219 B2 | | 1/2008 | Jacobsen et al. | |
| 8,156,635 B2 | * | 4/2012 | Cho et al. | 29/729 |
| 8,161,629 B2 | * | 4/2012 | Lin | 29/729 |
| 8,539,668 B2 | * | 9/2013 | Okada et al. | 29/738 |

* cited by examiner

*Primary Examiner* — Minh Trinh
(74) *Attorney, Agent, or Firm* — Toler Law Group, PC

(57) ABSTRACT

Printed circuit board (PCB) assembly tooling and methods are provided. Particular tooling includes a first tooling fixture having a first core component receiver to receive a first portion of a magnetic core to be coupled to a first side of a PCB. The tooling also has a second tooling fixture including a second core component receiver to receive a second portion of the magnetic core to be coupled on a second side of the PCB to the first portion of the magnetic core. The tooling also has an alignment component disposed on at least one of the first tooling fixture and the second tooling fixture. The alignment component enables alignment of the first tooling fixture and the second tooling fixture. When the first tooling fixture and the second tooling fixture are aligned, the first portion of the magnetic core and the second portion of the magnetic core are aligned.

16 Claims, 3 Drawing Sheets

PRINTED CIRCUIT BOARD ASSEMBLY TOOLING

STATEMENT OF GOVERNMENT RIGHTS

The invention was made with Government support under contract number FA4701-96-C-0025 awarded by the United States Air Force. The Government has certain rights in this invention.

FIELD OF THE DISCLOSURE

The present disclosure is generally related to printed circuit board assembly tooling and methods.

BACKGROUND

Certain printed circuit boards may include planar magnetic cores. The planar magnetic cores may interact with elements of the printed circuit boards, such as conductive traces, to form transformers, inductors, or other circuit elements. Planar magnetic cores may be assembled by adhering portions of the magnetic core to the printed circuit board. Since electrical characteristics of each planar magnetic core may depend upon physical characteristics (e.g., alignment and spacing) of the planar magnetic core, assembling planar magnetic cores by hand can be time consuming and prone to defects.

SUMMARY

Printed circuit board (PCB) assembly tooling and methods are disclosed. A particular PCB assembly tooling includes a first tooling fixture including a first core component receiver to receive a first portion of a magnetic core to be coupled to a first side of a PCB. The PCB assembly tooling includes a second tooling fixture including a second core component receiver to receive a second portion of the magnetic core to be coupled on a second side of the PCB to the first portion of the magnetic core. The PCB assembly tooling includes an alignment component disposed on at least one of the first tooling fixture and the second tooling fixture. The alignment component enables alignment of the first tooling fixture and the second tooling fixture. When the first tooling fixture and the second tooling fixture are aligned, the first portion of the magnetic core and the second portion of the magnetic core are aligned.

Another particular PCB assembly tooling includes a first tooling fixture including a first core component receiver to receive a first magnetic core bottom of a first magnetic core to be coupled to a first side of a PCB. The PCB assembly tooling also includes a second tooling fixture including a second core component receiver to receive a first magnetic core top of the first magnetic core to be coupled on a second side of the PCB to the first magnetic core bottom. During assembly of the magnetic core on the PCB, the first tooling fixture and the second tooling fixture interact to align the first magnetic core bottom and the first magnetic core top relative to one another and relative to the PCB. Also during assembly of the magnetic core on the PCB, the first tooling fixture and the second tooling fixture apply force to the first magnetic core bottom and to the first magnetic core top to maintain a specified gap between the first magnetic core bottom and the first magnetic core top.

A particular PCB assembly method includes aligning a first portion of a magnetic core with respect to a first side of a PCB using a first alignment device. The method includes applying a first bonding material to a surface of at least one of the first portion of the magnetic core and a second portion of the magnetic core. The method further includes coupling a second alignment device that retains the second portion of the magnetic core to the first alignment device. When the first alignment device and the second alignment device are coupled, the first portion and the second portion of the magnetic core are retained in a specified assembly position. The specified assembly position includes a specified gap between the first portion and the second portion of the magnetic core. The method also includes curing the first bonding material.

The features, functions, and advantages that have been described can be achieved independently in various embodiments or may be combined in yet other embodiments, further details of which are disclosed with reference to the following description and drawings.

DETAILED DESCRIPTION

Figure 1:
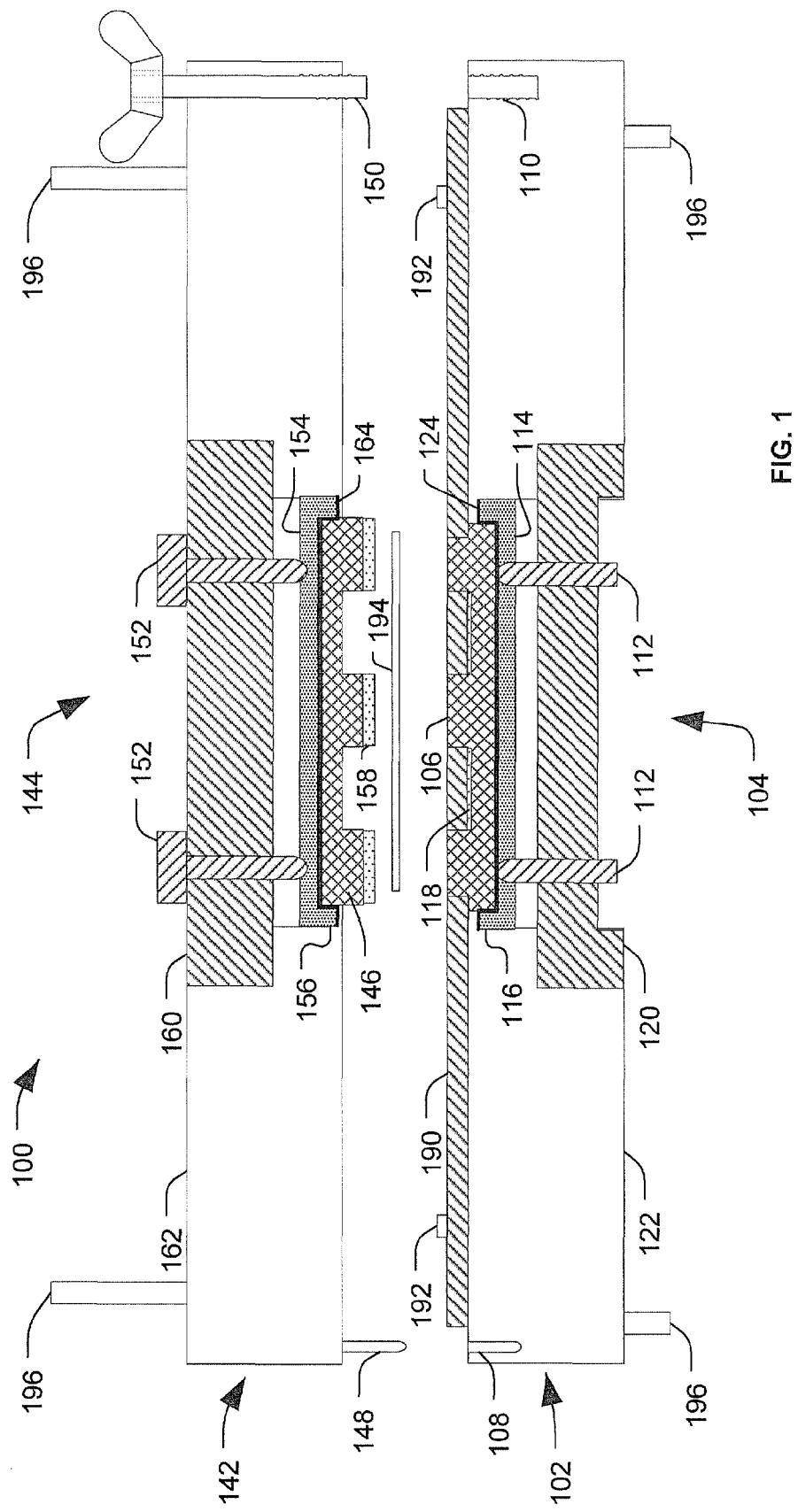
FIG. 1 is a schematic sectional view of a first particular embodiment of printed circuit board assembly tooling.

FIG. 1 is a schematic sectional view of a first particular embodiment of printed circuit board (PCB) assembly tooling 100. The PCB assembly tooling 100 includes a first tooling fixture 102 and a second tooling fixture 142. The first tooling fixture 102 and the second tooling fixture 142 may interact with a PCB 190 during assembly of the PCB 190 to facilitate assembly of a magnetic core on the PCB 190. For example, the magnetic core may include a top portion and a bottom portion that are coupled together during assembly of the PCB 190 to form a portion of a circuit on the PCB 190. To illustrate, the magnetic core may interact with a conductive coil on the PCB 190 as a planar core of a transformer. Dimensions of the magnetic core may affect characteristics of the circuit. Thus, the PCB assembly tooling 100 may retain a first portion 106 and a second portion 146 of the magnetic core in a specified assembly position during assembly of the magnetic core. For example, the PCB assembly tooling 100 may aid in aligning the first portion 106 and the second portion 146 of the magnetic core. In another example, the PCB assembly tooling 100 may facilitate urging the first portion 106 and the second portion 146 of the magnetic core toward the PCB 190 and toward each other during assembly. In yet another example, the PCB assembly tooling 100 may maintain one or more adhesive gaps between the first portion 106 of the magnetic core, the second portion 146 of the magnetic core, the PCB 190, or any combination thereof. In still another example, the PCB assembly tooling 100 may retain the specified assembly position of the first portion 106 and the second portion 146 of the magnetic core during curing of one or more adhesives used to assemble the magnetic core to the PCB 190.

In a particular embodiment, the first tooling fixture 102 includes a first core component receiver 104 to receive the first portion 106 of the magnetic core. The first portion 106 of the magnetic core is to be coupled to a first side of the PCB 190. For example, the first tooling fixture 102 may receive the bottom portion of the magnetic core that is to be coupled to a bottom surface of the PCB 190. The PCB assembly tooling 100 also includes a second tooling fixture 142 that includes a second core component receiver 144 to receive the second portion 146 of the magnetic core. The second portion 146 of the magnetic core is to be coupled, on a second side of the PCB 190, to the first portion 106 of the magnetic core. For example, the second portion 146 may include a top portion of the magnetic core.

In a particular embodiment, the first core component receiver 104 includes a first moveable member 114. The first moveable member 114 may retain the first portion 106 of the magnetic core and may apply a force to the first portion 106 of the magnetic core to move the first portion 106 of the magnetic core into an assembly position relative to the PCB 190. The second core component receiver 144 may include a second moveable member 154. The second moveable member 154 may retain the second portion 146 of the magnetic core and may apply a force to the second portion 146 of the magnetic core to move the second portion 146 of the magnetic core into an assembly position relative to the first portion 106 of the magnetic core. The first moveable member 114, the second moveable member 154, or both, may be formed of a material that is softer than the magnetic core. For example, the first moveable member 114, the second moveable member 154, or both, may be formed of a temperature stable polymer (i.e., a polymer with a low coefficient of thermal expansion), such as a polyestherimide. One example of such a temperature stable polymer material is Ultem™ available from GE Plastics. For example, the temperature stable polymer may have a coefficient of linear thermal expansion of less than about $3.2$ in/in/° F.$\times 10^{-5}$ The first moveable member 114, the second moveable member 154, or both, may include one or more spacers. For example, the first moveable member 114 may include spacers 116 that retain the first portion 106 of the magnetic core at a specified location relative to the PCB 190. The second core component receiver 144 may also include spacers 156 that retain the second portion 146 of the magnetic core at a specified location relative to the PCB 190. Thus, the spacers 116, 156 may retain the portions 106, 146 of the magnetic core at a desired assembly position relative to the PCB 190 and relative to one another. For example, the spacers 116, 156 may retain the portions 106, 146 of the magnetic core in alignment with one another along axes that are parallel to top and bottom surfaces of the PCB 190.

The assembly position of the first portion 106 of the magnetic core relative to the PCB 190 may also define an adhesive gap that accommodates a first adhesive 118 that flexibly couples the first portion 106 of the magnetic core to the PCB 190. For example, the first adhesive 118 may include a urethane adhesive material. The assembly position of the second portion 146 of the magnetic core relative to the first portion 106 of the magnetic core defines an adhesive gap that accommodates a second adhesive 158 that rigidly couples the second portion 146 of the magnetic core to the first portion 106 of the magnetic core. For example, the second adhesive 158 may include an epoxy adhesive material.

In a particular embodiment, the first tooling fixture 102 includes at least one PCB alignment component 192. The at least one PCB alignment component 192 facilitates alignment of the first tooling fixture 102 and the PCB 190. For example, the at least one PCB alignment component 192 may include one or more alignment pins of the first tooling fixture 102 that interact with one or more alignment openings of the PCB 190 to align the PCB 190 with the first tooling fixture 102.

The PCB assembly tooling 100 may also include an alignment component 148 disposed on the first tooling fixture 102, the second tooling fixture 142, or both. The alignment component 148 may enable alignment of the first tooling fixture 102 and the second tooling fixture 142. For example, the alignment component 148 may include one or more alignment pins on the second tooling fixture 142 that interact with one or more alignment receivers 108 of the first tooling fixture 102. When the first tooling fixture 102 and the second tooling fixture 142 are aligned, the first portion 106 of the magnetic core, the second portion 146 of the magnetic core, and the PCB 190 are aligned in the assembly position.

The PCB assembly tooling 100 may also include one or more retaining members 150 coupled to the first tooling fixture 102, the second tooling fixture 142, or both. The one or more retaining members 150 may be operable to secure the first tooling fixture 102 and the second tooling fixture 142 in an aligned position during use. For example, the retaining members 150 may include a threaded member coupled to the second tooling fixture 142 that is receivable in a threaded receiver 110 of the first tooling fixture 102.

In a particular embodiment, the tooling fixtures 102, 142 include one or more biasing members to urge the portions 106, 146 of the magnetic core toward the PCB 190 and toward each other. For example, the biasing members may include springs, threaded members, cams, other resilient or mechanical biasing members, or any combination thereof. To illustrate, the first tooling fixture 102 may include one or more first biasing members 112. The one or more first biasing members 112 may be operative to urge the first portion 106 of the magnetic core toward the PCB 190 during use by applying a force to the first moveable member 114. The second tooling fixture 142 may include one or more second biasing members 152. The one or more second biasing members 152 may be operative to urge the second portion 146 of the magnetic core toward the PCB 190 during use by applying a force to the second moveable member 154. In a particular embodiment, the first biasing members 112, the second biasing members 152, or both are adjustable to adjust a force applied to the portions 106, 146 of the magnetic core. For example, the first biasing members 112, the second biasing members 152, or both may be adjustable to minimize or reduce a gap between the first portion 106 of the magnetic core, the second portion 146 of the magnetic core, the PCB 190, or any combination thereof, while enabling proper function of the adhesives 118, 158. To illustrate, the first biasing members 112 and the second biasing members 152 may be adjustable to minimize the adhesive gap without squeezing out too much of the adhesives 118, 158. In a particular embodiment, the first biasing members 112 are adjusted to apply more force to the first portion 106 of the magnetic core than the second biasing members 152 apply to the second portion 146 of the magnetic core. In this embodiment, the force applied by the second biasing members 152 to the second portion 146 of the magnetic core is not sufficient to move the first portion 106 of the magnetic core out of position relative to the PCB 190 (e.g., out of contact with the bottom surface of the PCB 190).

In a particular embodiment, the core component receivers 104, 144 include removable inserts 120, 160. The removable inserts 120, 160 may interact with bodies 122, 162 of the tooling fixtures 102, 142. The removable inserts 120, 160 may retain the biasing members 112, 152 and provide support for the biasing members 112, 152 to urge the moveable members 114, 154 and the portions 106, 146 of the magnetic core toward the PCB 190.

During use, a release layer 124, 164 may be applied to the first core component receiver 104, the second core component receiver 144, or both. The first portion 106 of the magnetic core may be coupled to the first core component receiver 104 of the first tooling fixture 102. The first adhesive 118 may be applied to a surface of the first portion 104 of the magnetic core, such as one or more bonding surfaces of the first portion 104 of the magnetic core. The PCB 190 may be aligned with the first tooling fixture 102 by the at least one PCB alignment component 192, which may align the first portion 106 of the magnetic core with an assembly area of the PCB 190.

The second portion 146 of the magnetic core may be coupled to the second core component receiver 144. The second adhesive 158 may be applied to a surface of the second portion 146 of the magnetic core, such as one or more bonding surfaces of the second portion 146 of the magnetic core. The second tooling fixture 142 may be inverted and aligned with the first tooling fixture 102 using the alignment component 148. Depending on what spacing is specified between the first portion 104 and the second portion 144 of the magnetic core, a spacer 194, such as a paper layer, may be used between the first portion 104 and the second portion 144 of the magnetic core. The first and second tooling fixtures 102, 142 may be coupled together using the retaining members 110, 150. The PCB tooling assembly 100 may retain the first and second portions 104, 144 during curing of the adhesives 118, 158. For example, the PCB tooling assembly 100 may be placed on legs 196 in a curing oven to cure the adhesives 118, 158.

Figure 2:
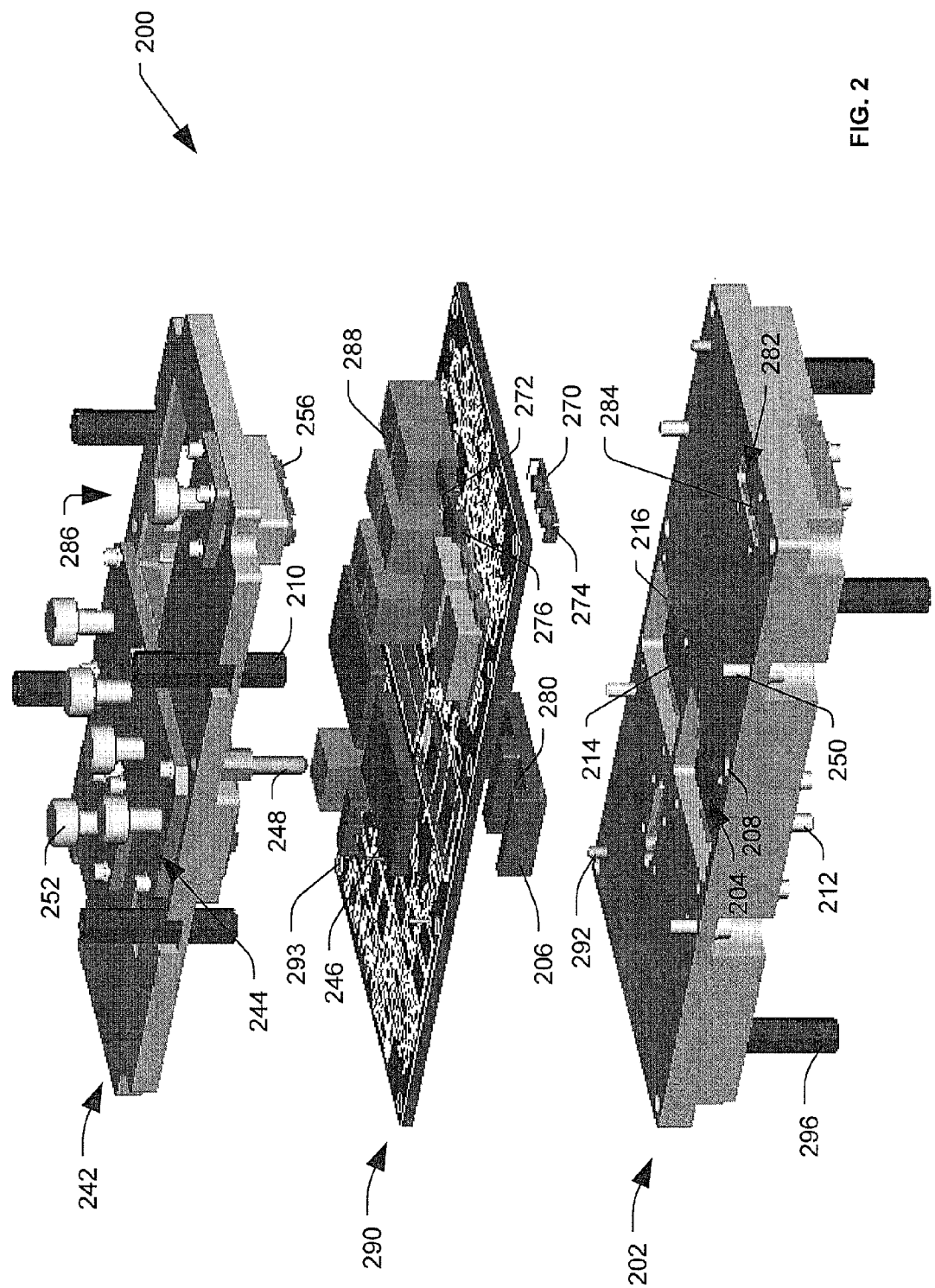
FIG. 2 is a perspective view of a second particular embodiment of printed circuit board assembly tooling.

FIG. 2 is a perspective view of a second particular embodiment of printed circuit board assembly tooling 200. The PCB assembly tooling 200 includes a first tooling fixture 202 and a second tooling fixture 242. The first tooling fixture 202 and the second tooling fixture 242 may interact with a PCB 290 during assembly of the PCB 290 to facilitate concurrent or substantially simultaneous assembly of a plurality of magnetic cores on the PCB 290. For example, each of the plurality of magnetic cores may include a top portion and a bottom portion that are coupled together during assembly of the PCB 290 to form a portion of a circuit on the PCB 290. Dimensions of each magnetic core may affect characteristics of the circuit. Additionally, the dimensions may be different for each of the magnetic cores. The PCB assembly tooling 200 may simultaneously retain portions of each of the magnetic cores in a corresponding specified assembly position during assembly of the PCB 290. For example, the PCB assembly tooling 200 may aid in aligning a first portion 206 and a second portion 246 of a first magnetic core and may, at the same time, aid in aligning a first portion 270 and a second portion 272 of a second magnetic core. Similarly, the PCB assembly tooling 200 may aid in aligning a first portion 274 and a second portion 276 of a third magnetic core, or any number of additional magnetic cores. The PCB assembly tooling 200 may facilitate urging the portions 202, 246, 270, 272, 274, 276 of the magnetic cores toward the PCB 290 and toward a counterpart portion (e.g., urging a top portion of a particular magnetic core toward a bottom portion of the particular magnet core) during assembly. The PCB assembly tooling 200 may maintain adhesive gaps between the portions 202, 246, 270, 272, 274, 276 of the magnetic cores and the PCB 290. The PCB assembly tooling 200 may retain a specified assembly position of each of the portions 202, 246, 270, 272, 274, 276 of the magnetic cores during curing of one or more adhesives used to assemble the magnetic cores to the PCB 290.

In a particular embodiment, the first tooling fixture 202 includes at least one first core component receiver 204 to receive the first portion 206 of a particular magnetic core. The at least one first core component receiver 204 may be a core component receiver, such as the first core component receiver 104 of FIG. 1. The second tooling fixture 242 includes at least one second core component receiver 244 corresponding to each of the at least one first core component receivers 204. The at least one second core component receiver 244 may receive the second portion 246 of the particular magnetic core. The at least one first core component receiver 224 may be a core component receiver, such as the second core component receiver 144 of FIG. 1.

In a particular embodiment, the core component receivers 204, 244 include moveable members 214. The first moveable members 214 may retain corresponding portions of magnetic cores and may apply a force to the portions of the magnetic cores to move the portions of the magnetic cores into respective assembly positions relative to the PCB 290 and relative to each other. The moveable members 214 may be formed of a material that is softer than the magnetic cores. For example, moveable members 214 may be formed of a polymer with a coefficient of thermal expansion with a specified amount of a coefficient of thermal expansion of the magnetic cores, such that the moveable members are able to retain the magnetic cores during a thermal curing process without damaging the magnetic cores of the moveable members.

The moveable members 214 may each include one or more spacers 216. The one or more spacers 216 may be affixed to the moveable members or machined from the moveable members. The spacers 216 may retain respective portions of a particular magnetic core at specified locations relative to the PCB 290 and relative to one another. The specified locations may be the assembly position of each portion. The assembly position of two portions of a particular magnetic core may define a particular alignment and positioning of the two portions relative to one another and relative to the PCB 290.

The assembly position of the two portions of the particular magnetic core may also define one or more adhesive gaps that accommodate adhesives used to assemble the magnetic cores. For example, a first adhesive may be applied to a bonding surface 280 of a first portion 206 of a particular magnetic core to secure the first portion 206 of the particular magnetic core to the PCB 290. Similarly, a second adhesive may be applied to a bonding surface (not shown) of a second portion 246 of the particular magnetic core to secure the second portion 246 of the particular magnetic core to the first portion 206 of the particular magnetic core. In a particular embodiment, the first adhesive cures to form a flexible bond between the first portion 206 of the particular magnetic core and the PCB 290, and the second adhesive cures to form a rigid bond between the first portion 206 of the particular magnetic core and the second portion 246 of the particular magnetic core. Thus, movement of the magnetic core relative to the PCB 290 can be accommodated without changing dimension of the magnetic core, which would change electrical characteristics or properties of the PCB 290.

In a particular embodiment, the first tooling fixture 202 includes at least one PCB alignment component 292. The at least one PCB alignment component 292 facilitates alignment of the first tooling fixture 202 and the PCB 290. For example, the at least one PCB alignment component 292 may include one or more alignment pins of the first tooling fixture 202 that interact with one or more alignment openings 293 of the PCB 290 to align the PCB 290 with the first tooling fixture 202.

The PCB assembly tooling 200 may also include an alignment component 248 disposed on the first tooling fixture 202, the second tooling fixture 242, or both. The alignment component 248 may enable alignment of the first tooling fixture 202 and the second tooling fixture 242. For example, the alignment component 248 may include one or more alignment pins on the second tooling fixture 242 that interact with one or more alignment receivers 208 of the first tooling fixture 202. When the first tooling fixture 202 and the second tooling fixture 242 are aligned, corresponding portions of plurality of magnetic cores and the PCB 190 are aligned in respective assembly positions.

The PCB assembly tooling 200 may also include one or more retaining members 250 coupled to the first tooling fixture 202, the second tooling fixture 242, or both. The one or more retaining members 250 may be operable to secure the first tooling fixture 202 and the second tooling fixture 242 in an aligned position during use. For example, the retaining members 250 may include a threaded member coupled to the first tooling fixture 202 that is receivable in a threaded receiver 210 of the second tooling fixture 242.

In a particular embodiment, the tooling fixtures 202, 242 include one or more biasing members 212, 252 to urge the portions the plurality of magnetic cores toward the PCB 290 and toward each other. For example, the biasing members 212, 252 may include springs, spring plungers, threaded members, cams, other resilient or mechanical biasing members, or any combination thereof. In a particular embodiment, the biasing members 212, 252 are independently adjustable to adjust gaps (e.g., adhesive gaps) between the corresponding portions of the plurality of magnetic cores, gaps between the portions of the plurality of magnetic cores and the PCB 290, or any combination thereof.

During use, a release layer (not shown in FIG. 2) may be applied to the core component receivers. The bottom portions of the plurality of magnetic cores may be coupled to the core component receiver of the first tooling fixture 202. A first adhesive may be applied to surfaces of the bottom portions. The PCB 290 may be aligned with the first tooling fixture 202 using the at least one PCB alignment component 292. Aligning the PCB 290 with the first tooling fixture 202 may align the bottom portions of the plurality of magnetic cores with respective assembly areas of the PCB 290.

Top portions of the plurality of magnetic cores may be coupled to the core component receivers of the second tooling fixture 242. A second adhesive (not shown in FIG. 2) may be applied to surfaces of the top portions. The second tooling fixture 242 may be inverted and aligned with the first tooling fixture 202 using the alignment component 248. Depending on what spacing is specified between the top and bottom portion of each magnetic core, a filler or a spacer may be used. The first and second tooling fixtures 202, 242 may be coupled together using the retaining members 210, 250. The PCB tooling assembly 200 may retain the top and bottom portions of the plurality of magnetic cores at respective assembly positions during curing of the adhesives. For example, the PCB tooling assembly 200 may be placed on legs 296 in a curing oven to cure the adhesives.

In a particular embodiment, one or more of the core component receivers may be adapted to assemble two or more magnetic cores simultaneously. For example, a particular core component receiver 282 of the first tooling fixture 202 may include a dividing spacer 284. A core component receiver of the second tooling fixture 242 that corresponds to the particular core component receiver 282 of the first tooling fixture 202 may also have a dividing spacer (not shown in FIG. 2 due to the perspective view). The dividing spacers 284 may enable each of the core component receivers 282 to retain and assemble two or more magnetic cores simultaneously. For example, a first magnetic core including a top portion 272 and a bottom portion 270 may be retained and assembled on a first side of the core component receivers 282. A second magnetic core including a second top portion 276 and a second bottom portion 274 may be simultaneously retained and assembled on a second side of the core component receivers 282.

The PCB assembly tooling 200 may also include one or more openings 286 to accommodate portions of the PCB 290, such as particular components 288 of the PCB 290 that may interfere with assembly of the plurality of magnetic cores on the PCB 290.

Figure 3:
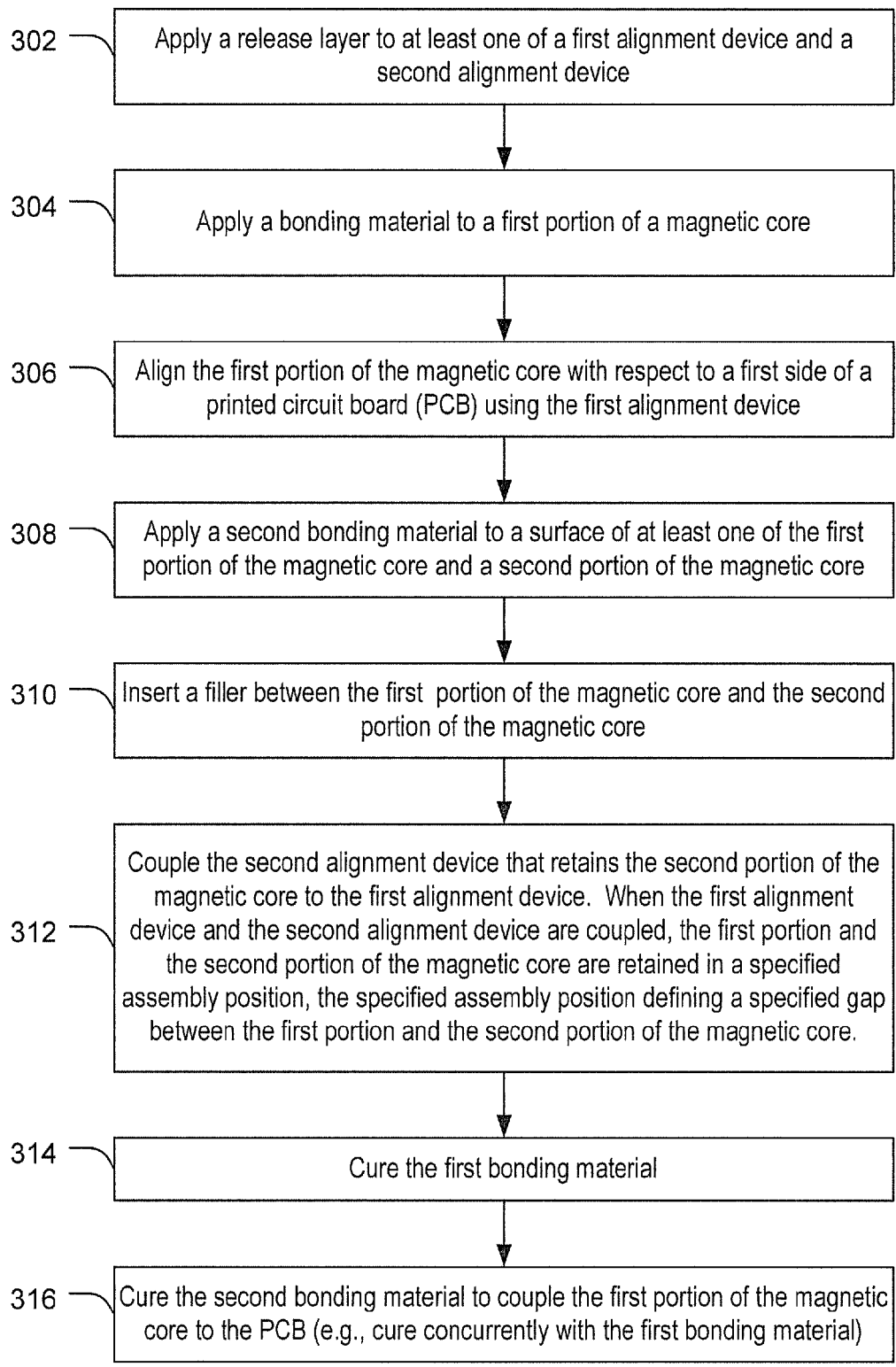
FIG. 3 is a flowchart of a particular embodiment of a method of manufacturing a heat exchange core.

FIG. 3 is a flowchart of a particular embodiment of a method of assembling a printed circuit board (PCB). The method may include, at 302, applying a release layer to one or more alignment devices. The alignment devices may includes portions of a PCB assembly tooling, such as the first tooling fixture 102 or the second tooling fixture 142 of FIG. 1, or the first tooling fixture 202 or the second tooling fixture 242 of FIG. 2. The release layer may reduce adhesion of one or more bonding materials to the alignment devices during assembly of the PCB.

The method may also include, at 304, applying a first bonding material to a surface of a portion of a magnetic core. The magnetic core may include a first portion (e.g., a magnetic core bottom) and a second portion (e.g., a magnetic core top). The first portion may be coupled to a first side of the PCB (e.g., a bottom surface of the PCB) and the second portion may be coupled to the first portion on a second side of the PCB to form the magnetic core. For example, the first bonding material may be applied to a bonding surface of the first portion of the magnetic core, which may be applied to a bottom of the PCB. The first bonding material may be curable to form a flexible bond between the first portion of the magnetic core and the PCB.

The method includes, at 306, aligning the first portion of a magnetic core with respect to the first side of the PCB using a first alignment device. For example, the first alignment device may include one or more core component receivers. To illustrate, the first alignment device may include a plurality of core component receivers to simultaneously align a plurality of magnetic core bottoms with respect to the first side of the PCB. Each of the core component receivers may be adapted to receive a magnetic core portion to be coupled to the PCB. The magnetic core portions may be placed in the core component receivers and the first bonding material may be applied to the magnetic core portions.

The method may include, at 308, applying a second bonding material to a second portion of the magnetic core. The second bonding material may be curable to form a rigid bond between the first portion of the magnetic core and the second portion of the magnetic core. Thus, the first portion of the magnetic core may be flexibly bonded to the PCB and the second portion of the magnetic core may be rigidly bonded to the first portion of the magnetic core. The rigid bond may maintain physical dimensions of the magnetic core while the flexible bond allows the magnetic core to move relative to the PCB (e.g., due to mechanical vibration or stresses). The method may include, at 310, inserting a filler between the first portion of the magnetic core and the second portion of the magnetic core. The filler may facilitate maintaining a specified gap between the first portion of the magnetic core and the second portion of the magnetic core.

The method may also include, at 312, coupling a second alignment device that retains the second portion of the magnetic core to the first alignment device. When the first alignment device and the second alignment device are coupled, the first portion of the magnetic core and the second portion of the magnetic core are retained in a specified assembly position. For example, when the first alignment device and the second alignment device are coupled, a plurality of magnetic core bottoms may be simultaneously retained with respect to a corresponding plurality of magnetic core tops. The specified assembly position may include a specified gap between the first portion and the second portion of the magnetic core.

The method also includes, at 314, curing the first bonding material, and, at 316, curing the second bonding material. Curing the first bonding material may couple the first portion of the magnetic core to the PCB. Curing the second bonding materials may bond each of the plurality of magnetic core bottoms to one of the corresponding plurality of magnetic core tops. In a particular embodiment, the first bonding material and the second bonding material are cured concurrently or substantially simultaneously. For example, after the first alignment device and the second alignment device are coupled together, the PCB assembly tooling, including the first alignment device and the second alignment device may be subjected to a curing process, such as a thermal curing process.

Embodiments disclose herein provide improved assembly techniques and tooling for assembling magnetic cores on PCBs. The disclosed PCB assembly tooling enables rapid and reliable assembly of multiple magnetic cores on a PCB simultaneously. A specified assembly position of each portion of the magnetic cores can be maintained during assembly of the magnetic cores (e.g., while adhesives cure). Thus, rework of PCBs due to assembly mistakes related to the magnetic cores can be reduced. For example, hand assembly of a magnetic core may be subject to error since maintaining halves of the magnetic core in alignment laterally (i.e., side to side along a surface of the PCB) and simultaneously maintaining alignment of the halves vertically (i.e., to maintain a specified adhesive gap between the halves) can be difficult. To illustrate, slip along the adhesive gap can cause misalignment vertically and applying too much or too little pressure can lead to incorrect gapping horizontally. Additionally, hand assembly techniques may be limited when thermal curing is used to cure the adhesives, since the halves may not be held in place during the curing process. Rework of PCBs due to problems with the assembly of magnetic cores can lead to broken cores, damaged PCB and wasted time. Additionally, the disclosed PCB assembly tooling and techniques can increase production rates since multiple magnetic cores can be assembled simultaneously.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A printed circuit board (PCB) assembly tooling, comprising:
    a first tooling fixture including a first core component receiver to receive a first portion of a magnetic core to be bonded to a second portion of the magnetic core, wherein the first core component receiver includes a first moveable member to retain the first portion of the magnetic core;
    a second tooling fixture including a second core component receiver to receive the second portion of the magnetic core to be bonded to the first portion of the magnetic core; and
    an alignment component disposed on at least one of the first tooling fixture and the second tooling fixture, wherein the alignment component enables alignment of the first tooling fixture and the second tooling fixture, and wherein, when the first tooling fixture and the second tooling fixture are aligned, the first portion of the magnetic core and the second portion of the magnetic core are aligned.

2. The PCB assembly tooling of claim 1, further comprising one or more retaining members coupled to at least one of the first tooling fixture and the second tooling fixture, the one or more retaining members operable to secure the first tooling fixture and the second tooling fixture in an aligned position during use.

3. The PCB assembly tooling of claim 1, wherein the first tooling fixture comprises one or more first biasing members, the one or more first biasing members operative to urge the first portion of the magnetic core toward a PCB during use.

4. The PCB assembly tooling of claim 3, wherein at least one of the one or more first biasing members is adjustable to adjust a gap between the first portion of the magnetic core and the second portion of the magnetic core.

5. The PCB assembly tooling of claim 3, wherein the one or more first biasing members urge the first portion of the magnetic core toward a first side of the PCB, wherein one or more second biasing members urge the second portion of the magnetic core toward a second side of the PCB.

6. The PCB assembly tooling of claim 1, wherein the first core component receiver includes one or more spacers that retain the first portion of the magnetic core at a specified assembly position relative to the PCB.

7. The PCB assembly tooling of claim 1, wherein the first moveable member is configured to apply a force to the first portion of the magnetic core to move the first portion of the magnetic core into an assembly position of the first portion of the magnetic core relative to a PCB.

8. The PCB assembly tooling of claim 7, wherein the assembly position of the first portion of the magnetic core relative to the PCB defines an adhesive gap that accommodates an adhesive that flexibly couples the first portion of the magnetic core to the PCB.

9. The PCB assembly tooling of claim 1, wherein the first tooling fixture includes at least one PCB alignment component, wherein the at least one PCB alignment component facilitates alignment of the first tooling fixture and a PCB.

10. The PCB assembly tooling of claim 1, wherein the second core component receiver comprises a second moveable member to retain the second portion of the magnetic core.

11. The PCB assembly tooling of claim 10, wherein the second moveable member is configured to apply a force to the second portion of the magnetic core to move the second portion of the magnetic core into an assembly position relative to the first portion of the magnetic core.

12. The PCB assembly tooling of claim 11, wherein the assembly position of the second portion of the magnetic core relative to the first portion of the magnetic core defines an adhesive gap that accommodates an adhesive, and wherein the second portion of the magnetic core is bonded to the first portion of the magnetic core using the adhesive.

13. The PCB assembly tooling of claim 10, wherein the second moveable member includes a material that is softer than the magnetic core.

14. The PCB assembly tooling of claim 1, wherein the second tooling fixture comprises one or more second biasing members, the one or more second biasing members operative to urge the second portion of the magnetic core toward the PCB during use.

15. The PCB assembly tooling of claim 14, wherein the one or more second biasing members are adjustable to adjust a gap between the first portion of the magnetic core and the second portion of the magnetic core.

16. The PCB assembly tooling of claim 1, wherein the first moveable member includes a material that is softer than the magnetic core.

* * * * *